United States Patent
Yang et al.

(10) Patent No.: US 10,877,116 B2
(45) Date of Patent: Dec. 29, 2020

(54) BIRDCAGE MAGNETIC RESONANCE IMAGING (MRI) COIL WITH OPEN SHIELD FOR SINGLE TUNE MRI COIL AND MULTI-TUNE MRI COIL

(71) Applicant: Quality Electrodynamics, LLC, Mayfield Village, OH (US)

(72) Inventors: Xiaoyu Yang, Indiana, PA (US); Chris Allen, Euclid, OH (US); Tsinghua Zheng, Chesterland, OH (US); Haoqin Zhu, Mayfield Village, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 0 days.

(21) Appl. No.: 16/387,800

(22) Filed: Apr. 18, 2019

(65) Prior Publication Data
US 2019/0331744 A1 Oct. 31, 2019

Related U.S. Application Data

(60) Provisional application No. 62/662,364, filed on Apr. 25, 2018.

(51) Int. Cl.
*G01R 33/34* (2006.01)
*G01R 33/385* (2006.01)
*G01R 33/36* (2006.01)

(52) U.S. Cl.
CPC ... *G01R 33/34076* (2013.01); *G01R 33/3635* (2013.01); *G01R 33/385* (2013.01)

(58) Field of Classification Search
CPC ............ G01R 33/34076; G01R 33/385; G01R 33/3635; G01R 33/422
See application file for complete search history.

(56) References Cited

U.S. PATENT DOCUMENTS

| 5,557,247 | A | 9/1996 | Vaughn, Jr. | |
| 2017/0299671 | A1* | 10/2017 | Holle | G01R 33/5659 |
| 2018/0299521 | A1* | 10/2018 | Leussler | G01R 33/422 |

OTHER PUBLICATIONS

Brown, Ryan. "Multi-Tuned Coils." Proc. Intl. Soc. Mag. Reson. Med. 24 (2016).

(Continued)

*Primary Examiner* — Susan S Lee
(74) *Attorney, Agent, or Firm* — Eschweiler & Potashnik, LLC (57) ABSTRACT

Embodiments relate to birdcage coils with in-plane open RF shielding capable of operating at 7T and higher field strength. One example embodiment comprises a first birdcage circuit and second birdcage circuit, each comprising two rings, N rungs that electrically connect the two rings of that circuit, a plurality of capacitors in the first birdcage circuit to form a first birdcage coil, and an optional plurality of capacitors in the second birdcage circuit to form a second birdcage coil when included or a non-resonant RF shield when omitted, wherein the first birdcage circuit is electrically isolated from the second birdcage circuit, wherein the first birdcage circuit and the second birdcage circuit have a common cylindrical axis, and wherein the N rungs of the second birdcage circuit are azimuthally rotated through a first angle relative to the N rungs of the first birdcage circuit.

20 Claims, 8 Drawing Sheets

(56) References Cited

OTHER PUBLICATIONS

Lanz et al. "Concentrically Shielded Surface Coils—A New Method for Decoupling Phased Array Elements." International Society for Magnetic Resonance in Medicine. ISMRM 14th Scientific Meeting, Seattle, Washington, USA, May 6-12, 2006.

Fitzsimmons et al. "Double Resonant Quadrature Birdcage." Magn. Reson. Med., 30: 107-114. Published Jul. 1993.

Ledden et al. "Birdcage Volume Transmit, Eight Channel Receive Array System for Brain Imaging at 7T." International Society for Magnetic Resonance in Medicine. ISMRM 13th Scientific Meeting, Miami Beach, Florida, USA, May 7-13, 2005.

Jin, Jianming. "Electromagnetic Analysis and Design in Magnetic Resonance Imaging." CRC Press, ISBN No. 0-8493-9693-X, published on Sep. 29, 1998.

Fitzsimmons et al. "A Transformer-Coupled Double-Resonant Probe for NMR Imaging and Spectroscopy." Magnetic Resonance in Medicine 5,471-477 (1987), published Nov. 1987.

Penn State College of Medicine. "Center for NMR Research: Using the Birdcage Builder Java Web App." The date of publication is unknown. Retrieved online on Jul. 31, 2020 from https://research.med.psu.edu/departments/center-for-nmr-research/software/birdcage-builder-web-app/.

\* cited by examiner

BIRDCAGE MAGNETIC RESONANCE IMAGING (MRI) COIL WITH OPEN SHIELD FOR SINGLE TUNE MRI COIL AND MULTI-TUNE MRI COIL

REFERENCE TO RELATED APPLICATIONS

This application claims the benefit of U.S. Provisional Patent Applications No. 62/662,364 filed Apr. 25, 2018, entitled "BIRDCAGE MAGNETIC RESONANCE IMAGING (MRI) COIL WITH OPEN SHIELD FOR SINGLE TUNE MRI COIL AND MULTI-TUNE MRI COIL", the contents of which are herein incorporated by reference in their entirety.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils create the $B_1$ field that rotates the net magnetization in a pulse sequence. RF coils may also detect precessing transverse magnetization. Thus, RF coils may be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, f, of an RF coil is determined by the inductance (L) and capacitance (C) of the inductor capacitor circuit according to equation (1):

$$f = \frac{1}{2\pi\sqrt{LC}} \quad (1)$$

Imaging coils may need to be tuned. Tuning an imaging coil may include varying the value of a capacitor. Recall that frequency: $f=\omega/(2\pi)$, wavelength in vacuum: $\lambda=c/f$, and $\lambda=4.7$ m at 1.5 T. Recall also that the Larmor frequency: $f_0=\gamma B_0/(2\pi)$, where (for $^1H$ nuclei) $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

DETAILED DESCRIPTION

The present disclosure will now be described with reference to the attached drawing figures, wherein like reference numerals are used to refer to like elements throughout, and wherein the illustrated structures and devices are not necessarily drawn to scale.

Figure 1:
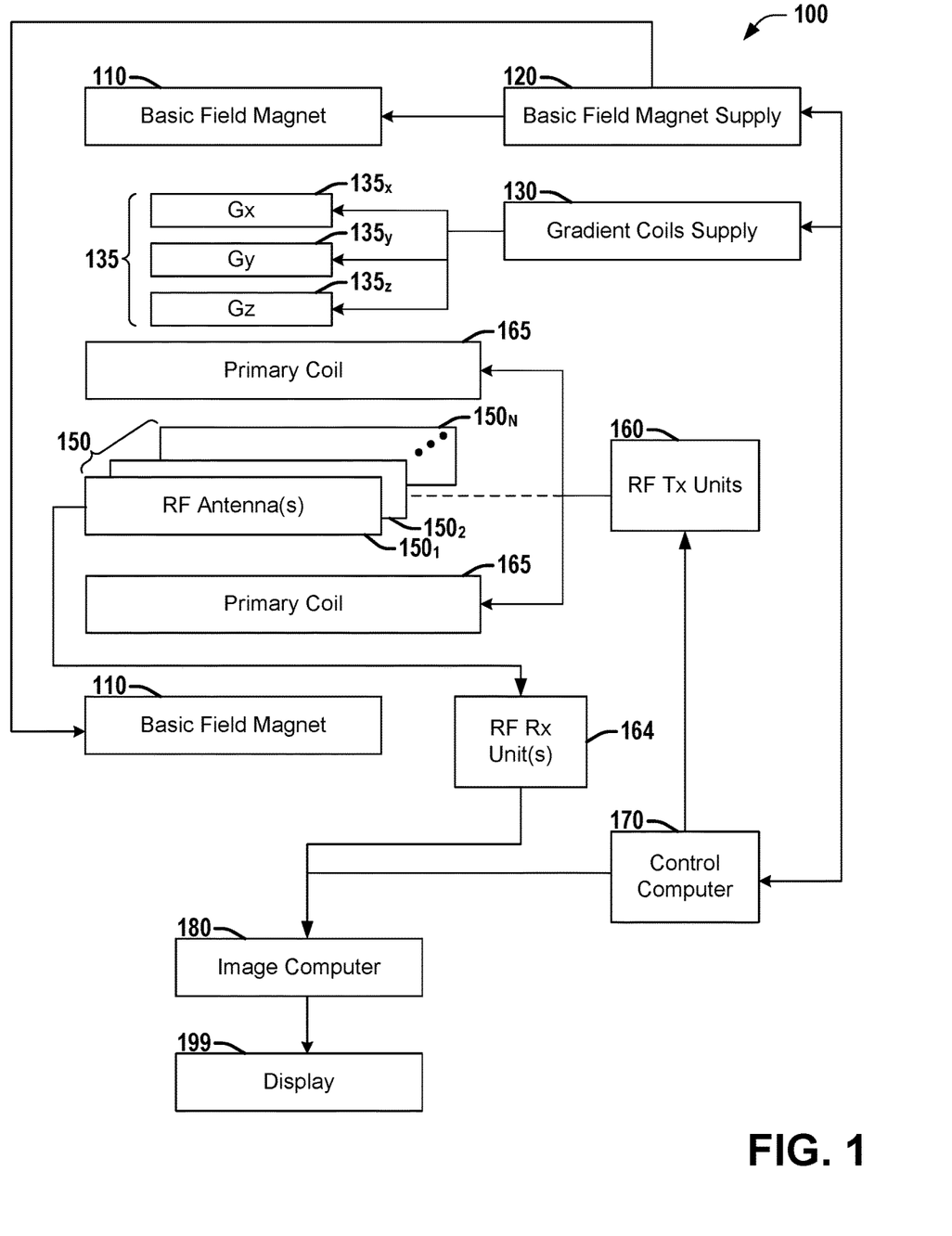
FIG. 1 is a block diagram illustrating an example MRI (Magnetic Resonance Imaging) apparatus that can be configured with example MRI RF (Radio Frequency) coils, coil elements, coil arrays, or circuitry according to one or more embodiments described herein.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet(s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during an MRI procedure.

MRI apparatus 100 can include a primary coil 165 configured to generate RF pulses. The primary coil 165 can be a whole body coil. The primary coil 165 can be, for example, a birdcage coil. The primary coil 165 can be controlled, at least in part, by an RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and to receive resulting magnetic resonance signals from an object to which the RF pulses are directed. In some embodiments, RF antennas 150 can be configured to inductively couple with primary coil 165 and generate RF pulses and to receive resulting magnetic resonance signals from an object to which the RF pulses are directed. In other embodiments, RF antennas 150 can be electrically coupled to a power source (e.g., RF Tx unit 160) that can drive RF antennas 150 to generate RF pulses, and RF antennas can also be configured to receive resulting magnetic resonance signals from an object to which the RF pulses are directed. In one embodiment, one or more members of the set of RF antennas 150 can be fabricated from flexible coaxial cable, or other conductive material. The set of RF antennas 150 can be connected with an RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

An MRI apparatus can include, among other components, a controller (e.g., control computer 170) and an RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

Radio frequency (RF) shielding can be used in magnetic resonance imaging (MRI) coils to reduce coil coupling to other electronics and to reduce radiation. For example, cylindrical RF shields have been used between a MRI scanner gradient coil and the whole body coil (WBC) since the beginning of MRI. In this approach, the RF shield is always larger than the WBC in diameter, regardless of the shape of the WBC, which can be, for example, cylindrical or elliptical. Analysis of the RF shield can be realized using an image method.

Another kind of RF shield is non-cylindrical and solid. One example of non-cylindrical and solid shielding is a concentric shield outside a loop element, which decreases RF coil coupling from other RF coil loop elements. The coupling is reduced because the RF shield re-directs magnetic flux from reaching too far, constraining any stray magnetic fields that can be present.

Recently, MRI scanners having magnetic field strengths of 7T and higher have started to enter the MR market and are being used in research and clinical study. One of the major challenges associated with such systems is to build a cylindrical birdcage-like transmitter/receiver (Tx/Rx) coil. One existing approach, similar to a WBC shield approach, built a 16-rung birdcage coil with the RF shield as the transmitter coil. In that approach, the coil diameter was 30 cm and the shield diameter was 37.5 cm. The whole birdcage coil and its shield were enclosed in a plastic former. However, as expected, using this size of coil can be challenging for any human subjects with a claustrophobic condition.

Another approach used a transverse electromagnetic (TEM) resonator at 7T and higher as a transmitter. A TEM coil also requires an RF shield as its return path and for shielding. Existing TEM coils have the same disadvantages as the birdcage with shield approach, particularly with respect to claustrophobic conditions. In summary, existing approaches to RF shielding for birdcage coils at 7T and higher field strengths employ larger diameter shields with no large openings in the shield except for slots to break gradient field heating. Thus, existing approaches are confining and not suited for patients with claustrophobic conditions.

In contrast to existing systems, various embodiments discussed herein can provide an open shield in the same plane as a birdcage coil, even in MRI systems operation with a $B_0$ field at 7T or higher. Various embodiments discussed herein can comprise or employ a coil that is significantly thinner than existing systems, and can facilitate the inclusion of mechanically created openings, which can reduce claustrophobic conditions.

Figure 2:
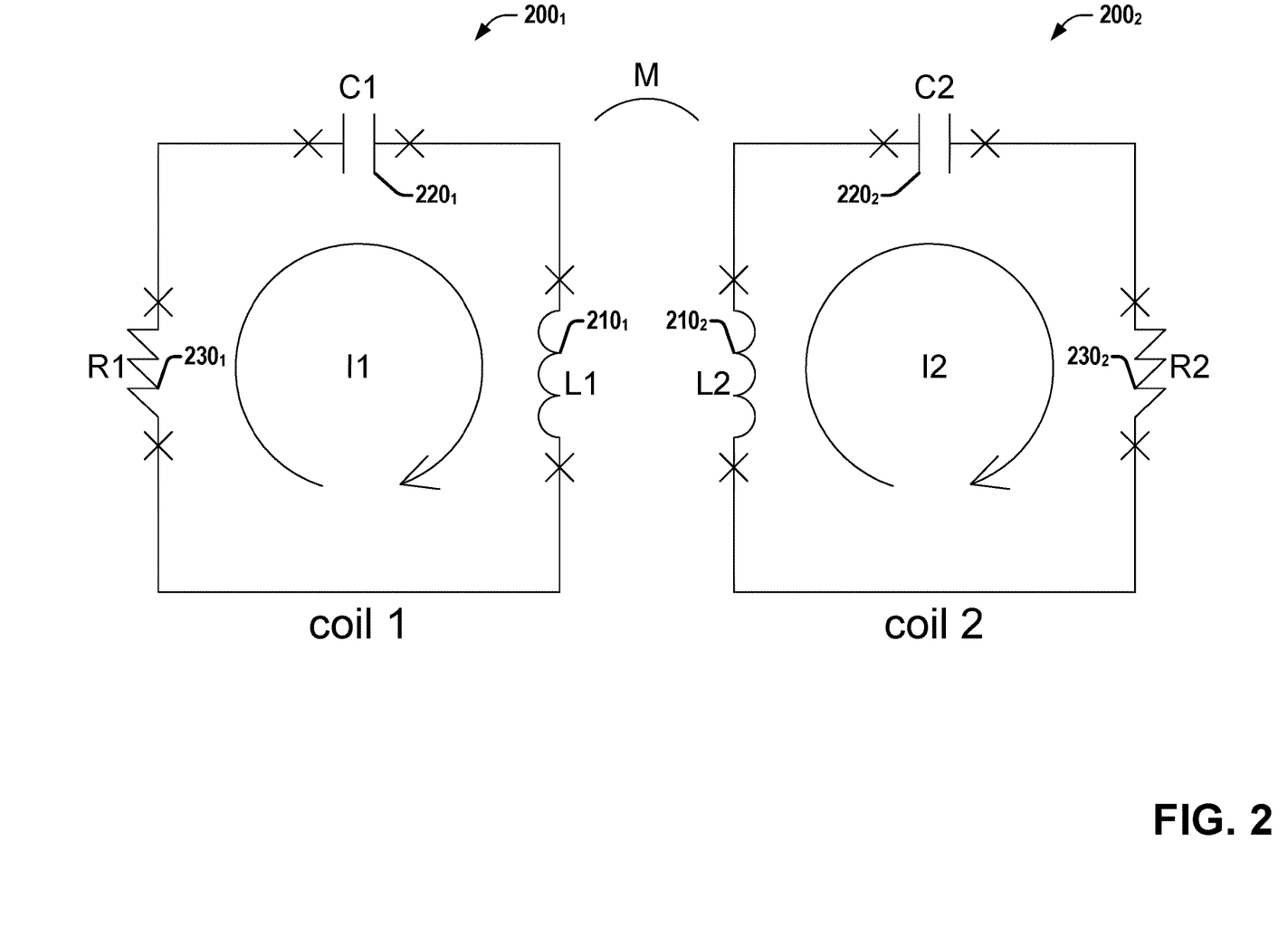
FIG. 2 is a diagram illustrating two resonant coils with strong mutual inductance between them, in connection with various embodiments discussed herein.

Referring to FIG. 2, illustrated is a diagram showing two resonant coils $200_1$ and $200_2$ with strong mutual inductance between them, in connection with various embodiments discussed herein. In various embodiments, the resonant frequencies of the two coils $200_1$ and $200_2$ can be very different from each other. FIG. 2 shows the equivalent circuit diagram of the two resonant coils with mutual inductive coupling.

In FIG. 2, C1 ($220_1$), L1 ($210_1$) and R1 ($230_1$) are the equivalent capacitance, inductance and resistance of coil 1 $200_1$, and C2 ($220_2$), L2 ($210_2$) and R2 ($230_2$) are the equivalent capacitance, inductance and resistance of coil 2 $200_2$. M is the mutual inductance between the coil 1 and the coil 2. For simplicity of calculation, M can be assumed to be positive. However, due to the sign of the net induced magnetic flux, the induced voltage of coils from each other can be positive or negative. For example, if the two coils have no overlap, then the induced voltage has a negative sign. If the two coils are facing each other and the distance between them is small, the sign is positive. If the two coils have overlap, the sign may be positive. The positive sign also applies for concentric configurations. In various examples and embodiments discussed herein, the coil configurations can be overlapping, facing each other, or concentric. In the following analysis, the positive sign is used. Thus, using Kirchhoff's Law, equations (2) can be obtained as follows:

$$\left(j\omega L1 - j\frac{1}{\omega C1} + R1\right) * I1 + j\omega M * I2 = 0 \qquad (2)$$

$$j\omega M * I1 + \left(j\omega L2 - j\frac{1}{\omega C2} + R2\right) * I2 = 0$$

If coil 2 $200_2$ is going to be used as a shield, then $$\frac{1}{\omega C2} = 0.$$

At high field strength $j\omega L2 \gg R2$, thus $R2$ can be thought of as 0, giving equation (3):

$$\left(j\omega\left(L1 - \frac{M^2}{L2}\right) - j\frac{1}{\omega C1} + R1\right) * I1 = 0 \qquad (3)$$

The resonant frequency of coil 1 with coil 2 as a shield is given by equation (4):

$$f_0 = \frac{1}{2\pi\sqrt{\left(L1 - \frac{M^2}{L2}\right) * C1}} \qquad (4)$$

The resonant frequency $f_0$ of coil 1 increases due to the $$-\frac{M^2}{L2} \text{ term.}$$

If L2 is similar to L1 and there is strong mutual inductance M between coil 1 and coil 2, then the frequency increase is very large. To maintain the same resonant frequency, C1 can increase by a large amount. The coil 2 shield can be concentric, or can overlap or face coil 1 at a very close distance as long as the net magnetic flux sign remains positive. Therefore, an open shield-like coil can increase coil resonant frequency significantly.

At 7T and higher magnetic fields traditional birdcage coils without close fitting cylindrical shielding only require very small capacitance to resonate because the frequency is high. For example, a head-sized 16-rung high-pass birdcage coil with a 26 cm diameter and a 26 cm length without an RF shield only needs about 4 pF to resonate based on analysis conducted via birdcage builder. This is very close to the parasitic capacitance between the two leads of the capacitor along the birdcage ring. As a result, the environment (e.g., parasitic capacitors) becomes a major part of the coil capacitor, that is, the coil resonates with the environment or it starts to radiate. Therefore, radiation loss is significant in coil loss, which results in very low coil Q, resulting in it becoming almost impossible to tune the birdcage coil without shielding at 7T and higher magnetic field. If a RF shield is used, then coil inductance decreases and the required resonant capacitance increases. As a result, the percentage of parasitic capacitance becomes less, and coil Q increases, resulting in the coil becoming resonant again and tunable. As can be seen, the RF shield reduces the coil efficiency. But the gain of coil Q can compensate for the coil efficiency loss. This is the primary reason that most existing birdcage transmitter coils at 7T and higher magnetic fields require close fitting cylindrical shields which is not claustrophobic-friendly, thereby limiting clinical utility.

Figure 3:
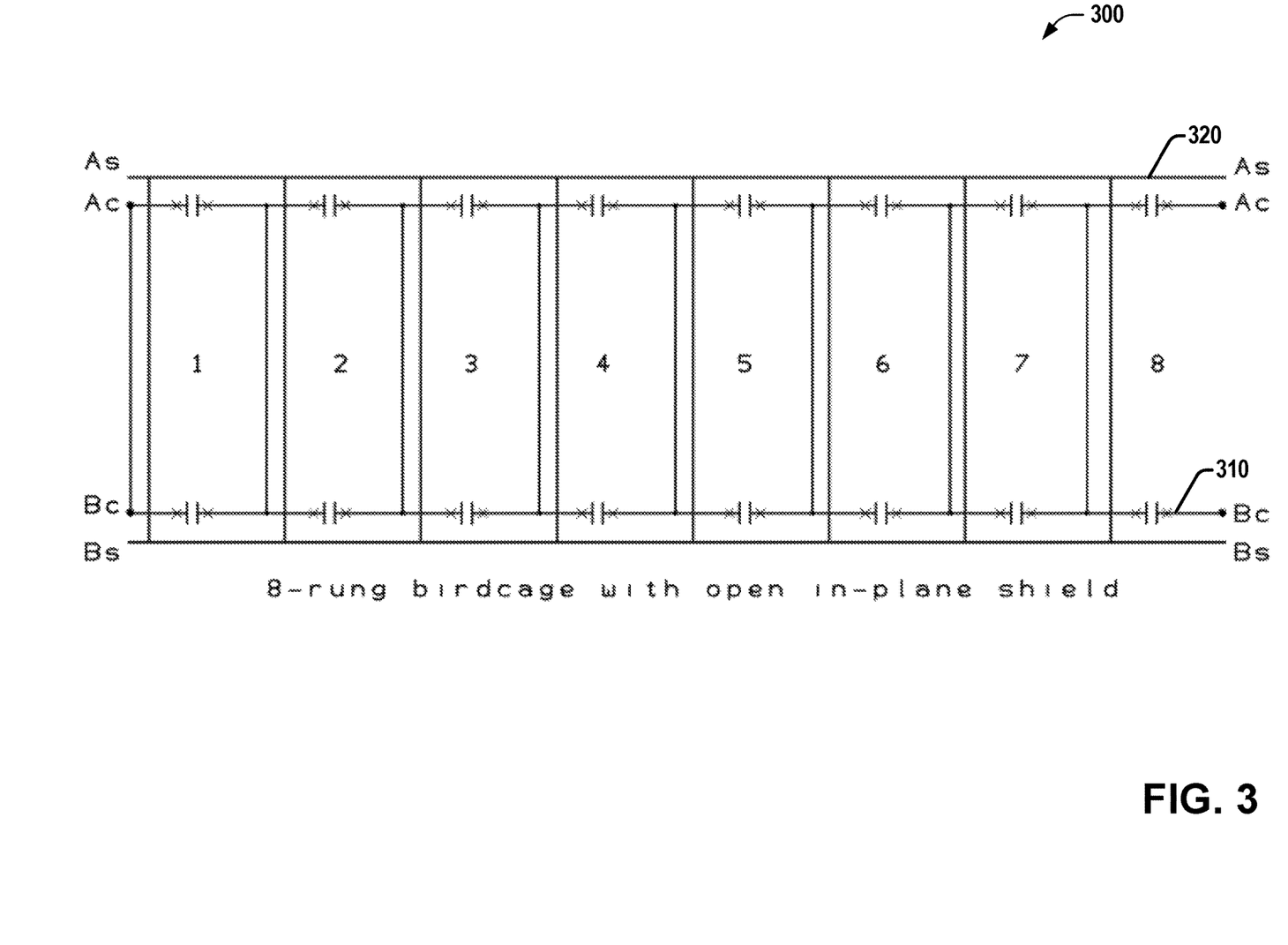
FIG. 3 is a diagram illustrating an example MRI RF coil apparatus that can be employed in or as a RF antenna in a MRI apparatus, according to various embodiments discussed herein.

To mitigate the claustrophobic situation created by existing approaches, various embodiments described herein can comprise an open and in-plane RF shield for a birdcage coil. Referring to FIG. 3, illustrated is a first example MRI RF coil apparatus 300 that can be employed in or as a RF antenna in a MRI apparatus (e.g., as a RF antenna $150_i$ in MRI apparatus 100), according to various embodiments discussed herein. Coil apparatus 300 comprises an example 8-rung birdcage coil 310 with an open and in-plane RF shield 320 (e.g., which can also be a birdcage circuit (e.g., a circuit with a birdcage structure, such that it comprises two approximately parallel (e.g., within a threshold deviation) rings connected to one another by a plurality of (e.g., N) rungs that are approximately perpendicular (e.g., within a threshold deviation) to the two rings, and optionally comprises capacitors (e.g., on at least one of the ring(s) or rung(s), when capacitors are included)). In FIG. 3, the connections and capacitors indicated by 310 (and Ac and Bc) are for the 8-rung birdcage coil. The conductive connections indicated by 320 (and As and Bs) are for the open RF shield, and can comprise, for example, thin wire or small width copper.

The shield 320 can be electrically isolated from the birdcage coil 310, and the shield 320 can be on the same plane of birdcage coil 310. In FIG. 3 (and similarly with other MRI RF coil apparatuses discussed herein), shield 320 and birdcage coil 310 are not electrically connected at the crossing points. In various embodiments, parasitic capacitance between shield 320 and birdcage coil 310 at the crossing points can be minimized by using narrower copper traces or jump wires. In various embodiments, the shield 320 can be arranged such that there is a very small distance between the plane of the birdcage coil 310 and the plane of the shield 320, for example, due to mechanical reasons. As an illustrative example, the wires for the birdcage 310 and the shield 320 can have diameters of one mm, two mm, or another (e.g., larger or smaller) diameter, which can result in a difference between the plane of the birdcage coil 310 and the plane of the shield 320. Other diameters can also be used in various embodiments. In various embodiments, the birdcage 310 and shield 320 can have substantially the same diameter, namely, they can have the same diameter within a margin that includes small differences in diameter arising from the size of wires or other circuit elements.

Although in FIG. 3 the birdcage coil 310 and shield 320 are represented in a plane, in various embodiments, both the birdcage coil 310 and shield 320 can be arranged cylindrically around a common axis, with the birdcage coil 310 having the two points labeled Ac in FIG. 3 representing the same point and the two points labeled Bc in FIG. 3 representing the same point, and the shield 320 having the two points labeled As in FIG. 3 representing the same point and the two points labeled Bs in FIG. 3 representing the same point. Additionally, in birdcage coils (e.g., coil 310, etc.) and shields (e.g., shield 320, etc.) discussed herein, the "rings" or "end rings" are the two circular conductive paths between the pair of points in FIG. 3, etc., with the same two letter indicator (e.g., Ac and Ac, Bc and Bc, As and As, Bs and Bs, etc.), while the "rungs" are the conductive paths that connect the two rings of the birdcage coil or shield. Moreover, while example birdcage coils shown herein show only capacitors located on the rings of the birdcage coil, in various embodiments, capacitors can be located only on the rings (e.g., in high-pass embodiments), only on the rungs (e.g., in low-pass embodiments), or on both the rings and rungs (e.g., in band-pass embodiments) of birdcage coils.

Figure 4:
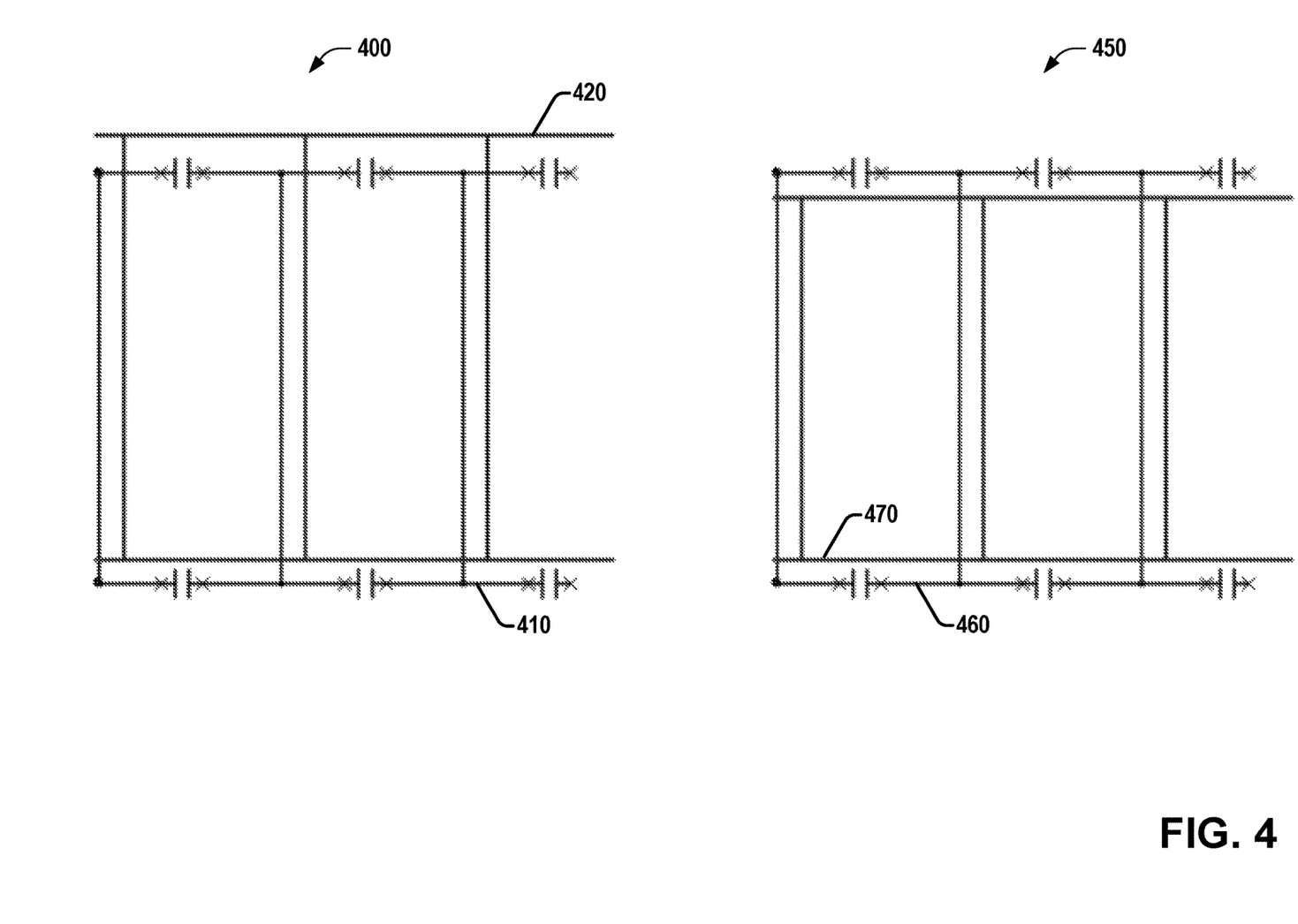
FIG. 4 is a diagram illustrating two alternative example configurations of an open shield and birdcage coil that can be employed in or as a RF antenna in a MRI apparatus, according to various embodiments discussed herein.

Referring to FIG. 4, illustrated is a pair of diagrams showing two alternative example configurations 400 and 450 of an open shield (420 or 470) and birdcage coil (410 or 460) that can be employed in or as a RF antenna in a MRI apparatus (e.g., as a RF antenna $150_i$ in MRI apparatus 100), according to various embodiments discussed herein. In the example configuration shown in FIG. 3, both rings of shield 320 are disposed outside of the rings of the birdcage coil 310 in the rung direction. As can be seen in configuration 400 and 450 of FIG. 4, in various embodiments, the rings of shields (420 or 470) can be either inside or outside of the ring of the birdcage (410 or 460) in the rung direction. All of these configurations provide effective shielding.

Figure 5:
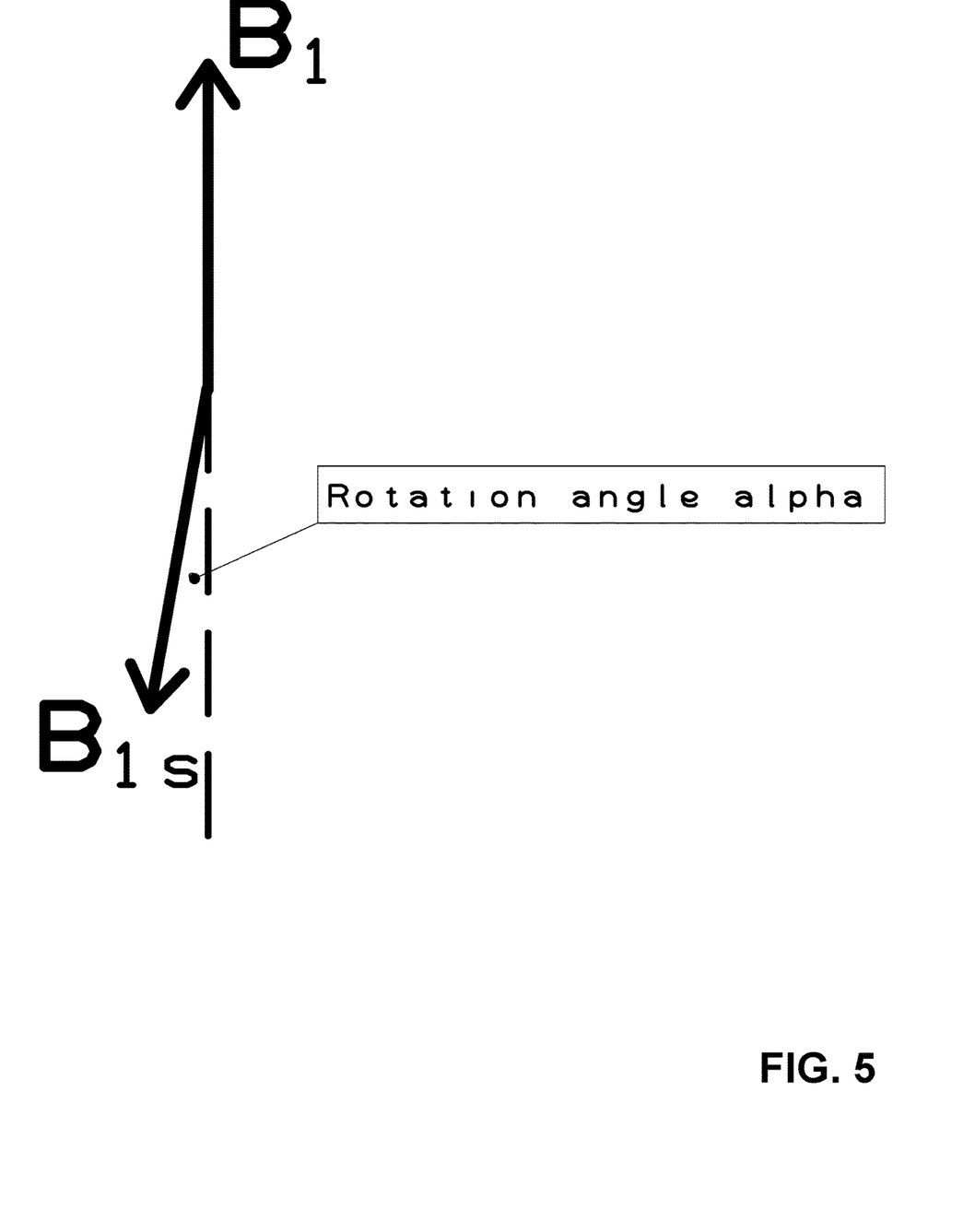
FIG. 5 is a diagram illustrating the induced $B_{1s}$ field from an open shield using the image method relative to a $B_1$ field from a birdcage coil, according to various embodiments discussed herein.

The effectiveness of the open shields (e.g., 320, 420, or 470, etc.) of various embodiments can be explained via the image method. The birdcage coil (e.g., 310, 410, or 460, etc.) can be used to generate two perpendicular uniform $B_1$ field in quadrature mode. One of these $B_1$ fields can be used for the following analysis. The uniform $B_1$ field can be considered a virtual coil. This virtual coil can be described by its equivalent inductance L and equivalent capacitance C. As can be seen from FIGS. 3-4, the open RF shield (e.g., 320, 420, or 470, etc.) can be rotated through a small angle azimuthally from the birdcage (e.g., rotated relative to a configuration wherein rungs of the birdcage coil and open RF shield are aligned) along the birdcage axis or $B_0$ direction. Referring to FIG. 5, illustrated is a diagram showing the induced $B_{1s}$ field from an open shield using the image method relative to a $B_1$ field from a birdcage coil, according to various embodiments discussed herein. For a physical rotation between birdcage coil (e.g., 310, 410, or 460, etc.) and open shield (e.g., 320, 420, or 470, etc.) of $0.5\alpha$, the rotation angle between the imaged birdcage coil and the birdcage coil is $\alpha$. The following discussion uses a for simplicity. The mutual inductance between the birdcage coil (e.g., 310, 410, or 460, etc.) and the open shield (e.g., 320, 420, or 470, etc.) can be estimated.

First, the distances between open shield rings and their birdcage direct neighboring rings can be assumed to be small and ignorable, or that the rung length is much greater than the distance between the shield rings and the direct neighboring rings. Second, the RF loss from the shield can be assumed to be small enough to be ignored. The induced voltage in the open shield can be written as in equation (5):

$$V_{induced} = -\frac{d(\phi)}{dt} = -M\frac{dI_{birdcage}}{dt} \quad (4)$$

where $\phi$ is the uniform mode virtual coil magnetic flux going through the induced uniform mode virtual coil of the open shield, and $I_{birdcage}$ is the equivalent current going through the virtual coil of the uniform $B_1$ field of the birdcage coil. Since the open shield is rotated from the birdcage by a small angle $0.5\alpha$, which is much smaller than $2\pi/N$, where N is the total number of rungs, the mutual inductance between the open shield and birdcage is close to $L*\cos(\alpha)$ regarding the uniform mode virtual coil. Therefore, the new resonant frequency of the birdcage coil with open shield can be written, per equation (4), as equation (6):

$$V_{induced} = -\frac{d(\phi)}{dt} = -M\frac{dI_{birdcage}}{dt} \quad (4)$$

Since $\alpha$ is small, the frequency increase can be very significant, involving an increase by $$\frac{1}{\sqrt{(1-\cos(\alpha)^2)}}$$

times. Therefore, significantly larger value capacitors can be used to achieve the same resonant frequency. At 7T and higher magnetic field, this open shield reduces radiation loss significantly. As a result, various embodiments comprise or employ birdcage coils configured to operate at high $B_0$ field (e.g., 7T or higher) that have good coil Q and are tunable. Furthermore, shields according to various embodiments discussed herein can accommodate opening(s) for claustrophobia minimization.

In addition to the aforementioned applications for birdcage coils at 7T and higher $B_0$ field, open shield apparatuses and techniques discussed herein can also be employed in other contexts. One example application of such open shields is in dual (or multi-) tune RF coil(s). X-nuclei MRI can provide additional information not available via proton MRI. Thus, dual or multi-tune RF coil(s) can have a unique role in X-nuclei MRI. There are several ways to implement a dual tune coil.

Figure 6:
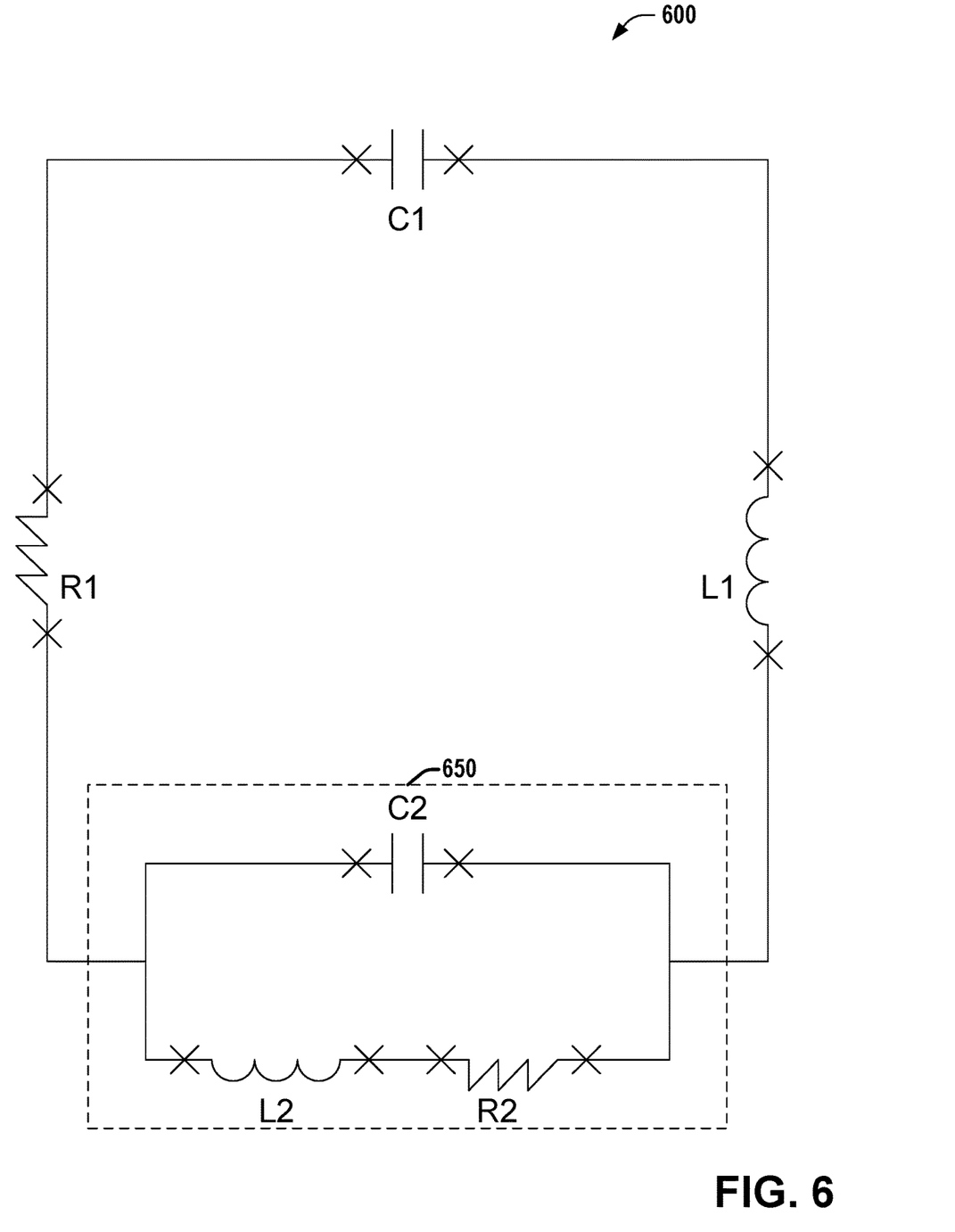
FIG. 6 is an example circuit diagram illustrating a first approach for implementing a dual tune coil, in connection with various aspects discussed herein.

Referring to FIG. 6, illustrated is an example circuit diagram of a first approach for implementing a dual tune coil, in connection with various aspects discussed herein. As shown in FIG. 6, a pole (e.g., via the circuit elements indicated in 650) can be inserted into a LC resonant circuit 600 to implement a dual tune coil.

A second approach to implement a dual tune coil is to use a "nest" design. The nested design can employ two concentric birdcage coils, an outer coil with a larger diameter and an inner coil with a smaller diameter. There are two ways to arrange a nested configuration. In a first configuration, the inner coil can be the lower frequency coil and the outer coil can be the higher frequency coil. In the first configuration, the lower frequency coil employs trap circuits at the higher frequency so that the inner lower coil will not shield the higher frequency coil. In the second configuration, the inner coil is the higher frequency coil and the outer coil is the lower frequency coil. In the second configuration, the outer coil can simply serve as a RF shield because the lower frequency coil acts like an inductor at higher frequency, which is similar to pure inductive shield. Regardless of the configuration, in existing systems, the diameter of one of the coils must be larger than the other one. As a result, one of the coils loses coil efficiency because it is a little bit farther away from the scanned object.

Figure 7:
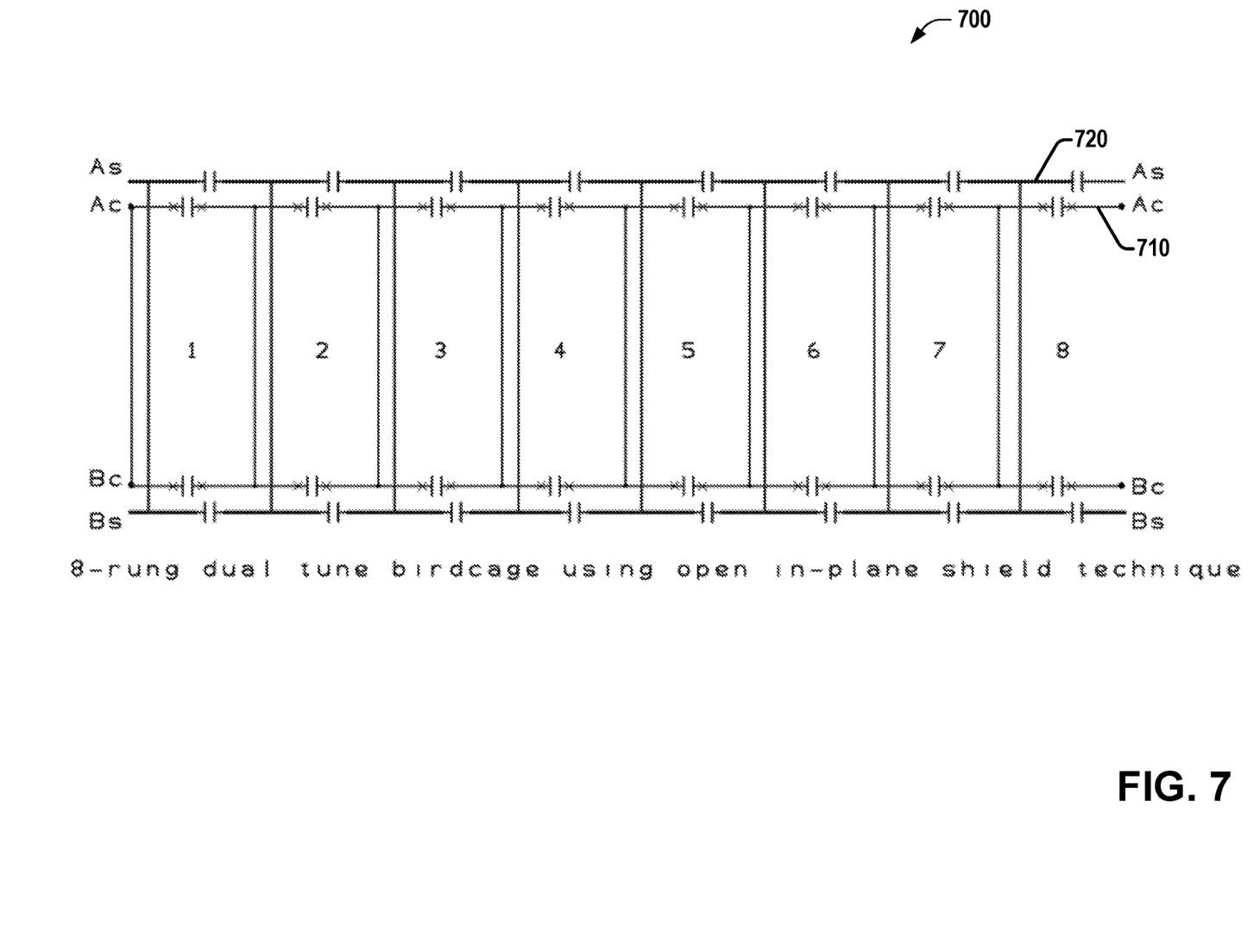
FIG. 7 is a diagram illustrating an example dual-tune MRI RF coil apparatus that can be employed in or as a RF antenna in a MRI apparatus, according to various embodiments discussed herein.
Figure 8:
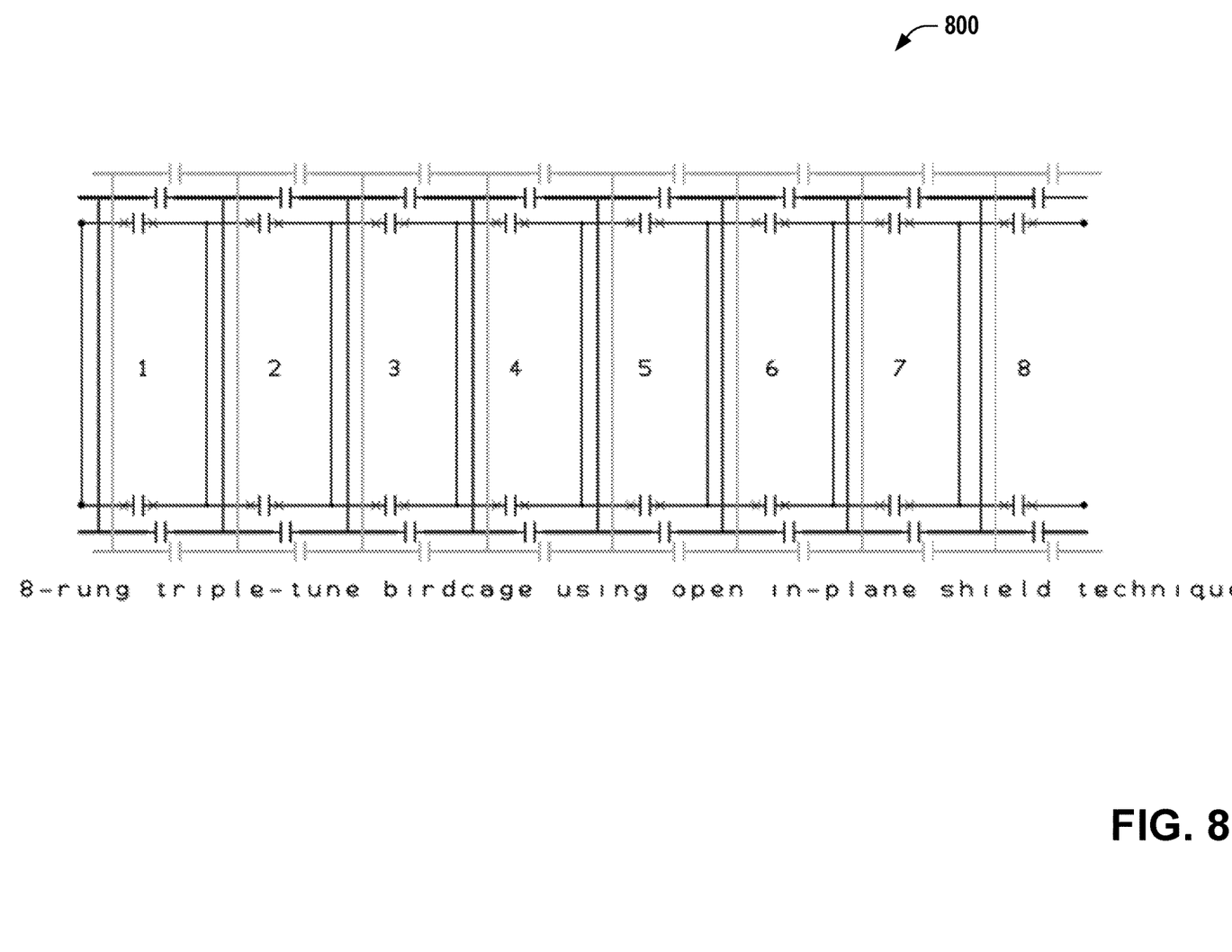
FIG. 8 is a diagram illustrating an example dual-tune MRI RF coil apparatus 800 that can be employed in or as a RF antenna in a MRI apparatus (e.g., as a RF antenna $150_i$ in MRI apparatus 100), according to various embodiments discussed herein.

In various embodiments, the open and in-plane shield (e.g., 320, 420, 470, etc.) can be configured as a lower frequency coil, which can provide a dual tune coil (e.g., apparatus 300, 400, 450, etc.) without sacrificing any coil efficiency due to coil size. Referring to FIG. 7, illustrated is a diagram of an example dual-tune MRI RF coil apparatus 700 that can be employed in or as a RF antenna in a MRI apparatus (e.g., as a RF antenna $150_i$ in MRI apparatus 100), according to various embodiments discussed herein. Coil apparatus 700 comprises a first example 8-rung birdcage coil 710 with an open and in-plane RF shield 720, and can be similar to coil apparatus 300, discussed above, with RF shield 720 configured as a second birdcage coil. In various embodiments, either birdcage coil 710 or RF shield 720 can be configured to operate at the lower frequency, with the other configured to operate at the higher frequency. Additionally, in various embodiments, this technique can be extended beyond dual-tune coils to any of a variety of multi-tune coils, such as a triple-tune coil, etc. For example, Referring to FIG. 8, illustrated is a diagram of an example dual-tune MRI RF coil apparatus 800 that can be employed in or as a RF antenna in a MRI apparatus (e.g., as a RF antenna $150_i$ in MRI apparatus 100), according to various embodiments discussed herein. Furthermore, although FIGS. 7-8 show RF shields extending beyond the inner birdcage coils in the rung direction on both sides, in various embodiments, other arrangements can be employed, as discussed in connection with FIG. 4, above.

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises a magnetic resonance imaging (MRI) radio frequency (RF) birdcage coil apparatus comprising: a first circuit comprising N rungs, two end rings and breaking point capacitors located either at rungs (low-pass) or at rings (high-pass) or both (band-pass), wherein the first circuit forms a first birdcage coil; a second circuit comprising N rungs, two end rings and optional breaking point capacitors either at rungs (low-pass) or at rings (high-pass) or both (band-pass), wherein the second circuit forms a RF shield when the breaking point capacitors are omitted or a second birdcage coil when the breaking point capacitors are included; an optional third circuit comprising N rungs, two end rings and optional breaking point capacitors either at rungs (low-pass) or at rings (high-pass) or both (bandpass), wherein the optional third circuit forms a RF shield when the breaking point capacitors are omitted or a third birdcage coil when the breaking point capacitors are included; wherein the first circuit, the second circuit, and the optional third circuit have the same diameter or a trivial diameter difference (e.g., arising from thicknesses (e.g., <3 mm, etc.) of wires of the first, second, and/or optional third circuits); wherein the first, second, and third circuits are not electrically connected to each other (e.g., at any cross points where rungs and rings of different birdcages/RF shields cross, etc.); wherein the first, second, and optional third circuits share a common axis in the $B_0$ direction, but are rotated from each other at different azimuthal angles.

A second example embodiment comprises the first example embodiment, wherein the second circuit is non-resonant as a RF shield and comprises no capacitors.

A third example embodiment comprises the first example embodiment, wherein the first birdcage coil is tuned to a first frequency, the second circuit is non-resonant, and the third circuit is omitted.

A fourth example embodiment comprises the first example embodiment, wherein the first birdcage coil is tuned to a first frequency, the second circuit comprises the second birdcage coil and is tuned to a second frequency, and the third circuit is one of omitted or non-resonant.

A fifth example embodiment comprises the first example embodiment, wherein the first birdcage coil is tuned to a first frequency, the second circuit forms the second birdcage coil and is tuned to a second frequency, and the third circuit forms the third birdcage coil and is tuned to a third frequency.

The following examples are additional embodiments.

Example 1 is a magnetic resonance imaging (MRI) radio frequency (RF) coil array configured to operate in at least one of a transmit (Tx) mode or a receive (Rx) mode, the MRI RF coil array comprising: a first birdcage circuit comprising two rings of the first birdcage circuit, N rungs of the first birdcage circuit that electrically connect the two rings of the first birdcage circuit, and a plurality of capacitors of the first birdcage circuit, wherein the first birdcage circuit forms a first birdcage coil; and a second birdcage circuit comprising two rings of the second birdcage circuit, and N rungs of the second birdcage circuit that electrically connect the two rings of the second birdcage circuit, wherein a diameter of the first birdcage circuit is within a threshold distance of a diameter of the second birdcage, wherein the threshold is based on thicknesses of wires of the first birdcage circuit and the second birdcage circuit, wherein the first birdcage circuit is electrically isolated from the second birdcage circuit, and wherein the first birdcage circuit and the second birdcage circuit have a common cylindrical axis, and wherein the N rungs of the second birdcage circuit are azimuthally rotated through a first angle relative to the N rungs of the first birdcage circuit.

Example 2 comprises the subject matter of any variation of any of example(s) 1, wherein the second birdcage circuit is non-resonant and configured to operate as a RF shield for the first birdcage coil.

Example 3 comprises the subject matter of any variation of any of example(s) 1-2, wherein N is at least 8.

Example 4 comprises the subject matter of any variation of any of example(s) 1-3, wherein the plurality of capacitors of the first birdcage circuit are arranged on the two rings of the first birdcage circuit.

Example 5 comprises the subject matter of any variation of any of example(s) 1-3, wherein the plurality of capacitors of the first birdcage circuit are arranged on the N rungs of the first birdcage circuit.

Example 6 comprises the subject matter of any variation of any of example(s) 1-3, wherein the plurality of capacitors of the first birdcage circuit are arranged on the two rings and the N rungs of the first birdcage circuit.

Example 7 comprises the subject matter of any variation of any of example(s) 1-6, wherein the second birdcage circuit comprises a plurality of capacitors of the second birdcage circuit, and wherein the second birdcage circuit forms a second birdcage coil.

Example 8 comprises the subject matter of any variation of any of example(s) 7, wherein the first birdcage coil is configured to operate at a first frequency and the second birdcage coil is configured to operate at a second frequency, wherein the first frequency is the Larmor frequency of a first nucleus in a given B0 field aligned along the cylindrical axis, wherein the second frequency is the Larmor frequency of a second nucleus in the given B0 field aligned along the cylindrical axis, wherein the first frequency is different than the second frequency and the first nucleus is different than the second nucleus.

Example 9 comprises the subject matter of any variation of any of example(s) 1-8, wherein the MRI RF coil array is configured to operate in a B0 field with a field strength of 7T or higher.

Example 10 comprises the subject matter of any variation of any of example(s) 1-9, wherein the N rungs of the second birdcage circuit extend beyond one ring of the two rings of the first birdcage circuit in a direction parallel to the common cylindrical axis.

Example 11 comprises the subject matter of any variation of any of example(s) 1-9, wherein the N rungs of the second birdcage circuit extend beyond both rings of the two rings of the first birdcage circuit in a direction parallel to the common cylindrical axis.

Example 12 comprises the subject matter of any variation of any of example(s) 1-9, wherein the N rungs of the first birdcage circuit extend beyond both rings of the two rings of the second birdcage circuit in a direction parallel to the common cylindrical axis.

Example 13 is a magnetic resonance imaging (MRI) radio frequency (RF) coil array configured to operate in at least one of a transmit (Tx) mode or a receive (Rx) mode, the MRI RF coil array comprising: a first birdcage circuit comprising two rings of the first birdcage circuit, N rungs of the first birdcage circuit that electrically connect the two rings of the first birdcage circuit, and a plurality of capacitors of the first birdcage circuit, wherein the first birdcage circuit forms a first birdcage coil; a second birdcage circuit comprising two rings of the second birdcage circuit, N rungs of the second birdcage circuit that electrically connect the two rings of the second birdcage circuit, and a plurality of capacitors of the second birdcage circuit, wherein the second birdcage circuit forms a second birdcage coil; and a third birdcage circuit comprising two rings of the third birdcage circuit, and N rungs of the third birdcage circuit that electrically connect the two rings of the second birdcage circuit, wherein a diameters of the first birdcage circuit, the second birdcage circuit, and the third birdcage circuit are within a threshold distance of each other, wherein the threshold is based on thicknesses of wires of the first birdcage circuit, the second birdcage circuit, and the third birdcage circuit, wherein the first birdcage circuit, the second birdcage circuit, and the third birdcage circuit are electrically isolated from each other, and wherein the first birdcage circuit, the second birdcage circuit, and the third birdcage circuit have a common cylindrical axis, wherein the N rungs of the second birdcage circuit are azimuthally rotated through a first angle relative to the N rungs of the first birdcage circuit, and wherein the N rungs of the third birdcage circuit are azimuthally rotated through a second angle relative to the N rungs of the first birdcage circuit, wherein the second angle is different than the first angle.

Example 14 comprises the subject matter of any variation of any of example(s) 13, wherein the third birdcage circuit is non-resonant and configured to operate as a RF shield for at least one of the first birdcage coil or the second birdcage coil.

Example 15 comprises the subject matter of any variation of any of example(s) 13-14, wherein N is at least 8.

Example 16 comprises the subject matter of any variation of any of example(s) 13-15, wherein the third birdcage circuit comprises a plurality of capacitors of the third birdcage circuit, and wherein the third birdcage circuit forms a third birdcage coil.

Example 17 comprises the subject matter of any variation of any of example(s) 16, wherein the first birdcage coil is configured to operate at a first frequency, the second birdcage coil is configured to operate at a second frequency, and the third birdcage coil is configured to operate at a third frequency, wherein the first frequency is the Larmor frequency of a first nucleus in a given B0 field aligned along the cylindrical axis, wherein the second frequency is the Larmor frequency of a second nucleus in the given B0 field aligned along the cylindrical axis, wherein the third frequency is the Larmor frequency of a third nucleus in the given B0 field aligned along the cylindrical axis, wherein the first frequency, the second frequency, and the third frequency are different, and wherein the first nucleus, the second nucleus, and the third nucleus are different.

Example 18 comprises the subject matter of any variation of any of example(s) 13-17, wherein the MRI RF coil array is configured to operate in a B0 field with a field strength of 7T or higher.

Example 19 is an apparatus, comprising: a magnetic resonance imaging (MRI) radio frequency (RF) coil apparatus configured to operate in at least one of a transmit (Tx) mode or a receive (Rx) mode, the MRI RF coil array comprising: a first birdcage circuit comprising two rings of the first birdcage circuit, N rungs of the first birdcage circuit that electrically connect the two rings of the first birdcage circuit, and a plurality of capacitors of the first birdcage circuit, wherein the first birdcage circuit forms a first birdcage coil; and a second birdcage circuit comprising two rings of the second birdcage circuit, and N rungs of the second birdcage circuit that electrically connect the two rings of the second birdcage circuit, wherein a diameter of the first birdcage circuit is within a threshold distance of a diameter of the second birdcage, wherein the threshold is based on thicknesses of wires of the first birdcage circuit and the second birdcage circuit, wherein the first birdcage circuit is electrically isolated from the second birdcage circuit, and wherein the first birdcage circuit and the second birdcage circuit have a common cylindrical axis, and wherein the N rungs of the second birdcage circuit are azimuthally rotated through a first angle relative to the N rungs of the first birdcage circuit, and wherein the apparatus comprises at least one mechanical opening between one or more of the N rungs of the first birdcage circuit and one or more of the N rungs of the second birdcage circuit.

Example 20 comprises the subject matter of any variation of any of example(s) 19, wherein the MRI RF coil array is configured to operate in a B0 field with a field strength of 7T or higher.

Example 21 is a MRI apparatus comprising a MRI RF coil array according to any variation of any of example(s) 1-20.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. Circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, Aft AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A magnetic resonance imaging (MRI) radio frequency (RF) coil array configured to operate in at least one of a transmit (Tx) mode or a receive (Rx) mode, the MRI RF coil array comprising:
    a first birdcage circuit comprising two rings of the first birdcage circuit, N rungs of the first birdcage circuit that electrically connect the two rings of the first birdcage circuit, and a plurality of capacitors of the first birdcage circuit, wherein the first birdcage circuit forms a first birdcage coil; and
    a second birdcage circuit comprising two rings of the second birdcage circuit, and N rungs of the second birdcage circuit that electrically connect the two rings of the second birdcage circuit,
    wherein a diameter of the first birdcage circuit is within a threshold distance of a diameter of the second birdcage circuit, wherein the threshold distance is based on thicknesses of wires of the first birdcage circuit and the second birdcage circuit,
    wherein the first birdcage circuit is electrically isolated from the second birdcage circuit, and
    wherein the first birdcage circuit and the second birdcage circuit have a common cylindrical axis, and wherein the N rungs of the second birdcage circuit are azimuthally rotated through a first angle relative to the N rungs of the first birdcage circuit.

2. The MRI RF coil array of claim 1, wherein the second birdcage circuit is non-resonant and configured to operate as a RF shield for the first birdcage coil.

3. The MRI RF coil array of claim 1, wherein N is at least 8.

4. The MRI RF coil array of claim 1, wherein the plurality of capacitors of the first birdcage circuit are arranged on the two rings of the first birdcage circuit.

5. The MRI RF coil array of claim 1, wherein the plurality of capacitors of the first birdcage circuit are arranged on the N rungs of the first birdcage circuit.

6. The MRI RF coil array of claim 1, wherein the plurality of capacitors of the first birdcage circuit are arranged on the two rings of the first birdcage circuit and the N rungs of the first birdcage circuit.

7. The MRI RF coil array of claim 1, wherein the second birdcage circuit comprises a plurality of capacitors of the second birdcage circuit, and wherein the second birdcage circuit forms a second birdcage coil.

8. The MRI RF coil array of claim 7, wherein the first birdcage coil is configured to operate at a first frequency and the second birdcage coil is configured to operate at a second frequency, wherein the first frequency is the Larmor frequency of a first nucleus in a given $B_0$ field aligned along the common cylindrical axis, wherein the second frequency is the Larmor frequency of a second nucleus in the given $B_0$ field aligned along the common cylindrical axis, wherein the first frequency is different than the second frequency and the first nucleus is different than the second nucleus.

9. The MRI RF coil array of claim 1, wherein the MRI RF coil array is configured to operate in a $B_0$ field with a field strength of 7T or higher.

10. The MRI RF coil array of claim 1, wherein the N rungs of the second birdcage circuit extend beyond one ring of the two rings of the first birdcage circuit in a direction parallel to the common cylindrical axis.

11. The MRI RF coil array of claim 1, wherein the N rungs of the second birdcage circuit extend beyond both rings of the two rings of the first birdcage circuit in a direction parallel to the common cylindrical axis.

12. The MRI RF coil array of claim 1, wherein the N rungs of the first birdcage circuit extend beyond both rings of the two rings of the second birdcage circuit in a direction parallel to the common cylindrical axis.

13. A magnetic resonance imaging (MRI) radio frequency (RF) coil array configured to operate in at least one of a transmit (Tx) mode or a receive (Rx) mode, the MRI RF coil array comprising:
a first birdcage circuit comprising two rings of the first birdcage circuit, N rungs of the first birdcage circuit that electrically connect the two rings of the first birdcage circuit, and a plurality of capacitors of the first birdcage circuit, wherein the first birdcage circuit forms a first birdcage coil;
a second birdcage circuit comprising two rings of the second birdcage circuit, N rungs of the second birdcage circuit that electrically connect the two rings of the second birdcage circuit, and a plurality of capacitors of the second birdcage circuit, wherein the second birdcage circuit forms a second birdcage coil; and
a third birdcage circuit comprising two rings of the third birdcage circuit, and N rungs of the third birdcage circuit that electrically connect the two rings of the third birdcage circuit,
wherein diameters of the first birdcage circuit, the second birdcage circuit, and the third birdcage circuit are within a threshold distance of each other, wherein the threshold distance is based on thicknesses of wires of the first birdcage circuit, the second birdcage circuit, and the third birdcage circuit,
wherein the first birdcage circuit, the second birdcage circuit, and the third birdcage circuit are electrically isolated from each other, and
wherein the first birdcage circuit, the second birdcage circuit, and the third birdcage circuit have a common cylindrical axis, wherein the N rungs of the second birdcage circuit are azimuthally rotated through a first angle relative to the N rungs of the first birdcage circuit, and wherein the N rungs of the third birdcage circuit are azimuthally rotated through a second angle relative to the N rungs of the first birdcage circuit, wherein the second angle is different than the first angle.

14. The MRI RF coil array of claim 13, wherein the third birdcage circuit is non-resonant and configured to operate as a RF shield for at least one of the first birdcage coil or the second birdcage coil.

15. The MRI RF coil array of claim 13, wherein N is at least 8.

16. The MRI RF coil array of claim 13, wherein the third birdcage circuit comprises a plurality of capacitors of the third birdcage circuit, and wherein the third birdcage circuit forms a third birdcage coil.

17. The MRI RF coil array of claim 16,
wherein the first birdcage coil is configured to operate at a first frequency, the second birdcage coil is configured to operate at a second frequency, and the third birdcage coil is configured to operate at a third frequency,
wherein the first frequency is the Larmor frequency of a first nucleus in a given $B_0$ field aligned along the common cylindrical axis,
wherein the second frequency is the Larmor frequency of a second nucleus in the given $B_0$ field aligned along the common cylindrical axis,
wherein the third frequency is the Larmor frequency of a third nucleus in the given $B_0$ field aligned along the common cylindrical axis,
wherein the first frequency, the second frequency, and the third frequency are different, and
wherein the first nucleus, the second nucleus, and the third nucleus are different.

18. The MRI RF coil array of claim 13, wherein the MRI RF coil array is configured to operate in a $B_0$ field with a field strength of 7T or higher.

19. An apparatus, comprising:
a magnetic resonance imaging (MRI) radio frequency (RF) coil array configured to operate in at least one of a transmit (Tx) mode or a receive (Rx) mode, the MRI RF coil array comprising:
a first birdcage circuit comprising two rings of the first birdcage circuit, N rungs of the first birdcage circuit that electrically connect the two rings of the first birdcage circuit, and a plurality of capacitors of the first birdcage circuit, wherein the first birdcage circuit forms a first birdcage coil; and
a second birdcage circuit comprising two rings of the second birdcage circuit, and N rungs of the second birdcage circuit that electrically connect the two rings of the second birdcage circuit,
wherein a diameter of the first birdcage circuit is within a threshold distance of a diameter of the second birdcage circuit, wherein the threshold distance is based on thicknesses of wires of the first birdcage circuit and the second birdcage circuit,
wherein the first birdcage circuit is electrically isolated from the second birdcage circuit, and
wherein the first birdcage circuit and the second birdcage circuit have a common cylindrical axis, and wherein the N rungs of the second birdcage circuit are azimuthally rotated through a first angle relative to the N rungs of the first birdcage circuit, and wherein the apparatus comprises at least one mechanical opening between one or more of the N rungs of the first birdcage circuit and one or more of the N rungs of the second birdcage circuit.

20. The apparatus of claim 19, wherein the MRI RF coil array is configured to operate in a $B_0$ field with a field strength of 7T or higher.

* * * * *